(12) United States Patent  
Lewis

(10) Patent No.: US 7,876,601 B2  
(45) Date of Patent: Jan. 25, 2011

(54) VARIABLE SIZED SOFT MEMORY MACROS IN STRUCTURED CELL ARRAYS, AND RELATED METHODS

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/814,604

(22) Filed: Jun. 14, 2010

(65) Prior Publication Data

US 2010/0244893 A1    Sep. 30, 2010

Related U.S. Application Data

(62) Division of application No. 12/548,976, filed on Aug. 27, 2009, now Pat. No. 7,768,819, which is a division of application No. 11/651,364, filed on Jan. 8, 2007, now Pat. No. 7,589,555.

(51) Int. Cl.
*G11C 11/00* (2006.01)

(52) U.S. Cl. .......................................... 365/154; 365/187

(58) Field of Classification Search .................. 365/154, 365/187, 188; 326/38, 39, 40, 41
See application file for complete search history.

(56) References Cited

U.S. PATENT DOCUMENTS

| | | | |
|---|---|---|---|
| 6,262,933 B1 | 7/2001 | Chang et al. | |
| 6,928,020 B2 | 8/2005 | Takahashi et al. | |
| 7,084,665 B1 | 8/2006 | Lewis et al. | |
| 7,277,309 B1 | 10/2007 | Banachowicz et al. | |
| 7,391,236 B2 | 6/2008 | Lewis et al. | |
| 7,493,585 B1 | 2/2009 | Ahmed et al. | |
| 7,583,103 B2 * | 9/2009 | Lewis et al. | ................... 326/38 |
| 2007/0210827 A1 | 9/2007 | Chua et al. | |

\* cited by examiner

*Primary Examiner*—Vu A Le  
(74) *Attorney, Agent, or Firm*—Ropes & Gray LLP; Robert R. Jackson

(57) ABSTRACT

The logic cells (HLEs) of a structured application-specific integrated circuit (structured ASIC) can be used to provide memory blocks of various sizes. Any one or more of several techniques may be employed to facilitate doing this for various user designs that may have different requirements (e.g., in terms of size) for such memory blocks. For example, pre-designed macros of memory blocks may be provided and then combined as needed to provide memory blocks of various sizes. Placement constraints may be observed for certain portions of the memory circuitry (e.g., the memory core), while other portions (e.g., address predecoder circuitry, write and read data registers, etc.) may be located relatively freely.

12 Claims, 10 Drawing Sheets

VARIABLE SIZED SOFT MEMORY MACROS IN STRUCTURED CELL ARRAYS, AND RELATED METHODS

CROSS REFERENCE TO RELATED APPLICATION

This is a division of application Ser. No. 12/548,976, filed Aug. 27, 2009, now U.S. Pat. No. 7,768,819 which is a division of application Ser. No. 11/651,364, filed Jan. 8, 2007 (now U.S. Pat. No. 7,589,555), all of which are hereby incorporated by reference herein in their entireties.

BACKGROUND OF THE INVENTION

Field-programmable gate arrays (FPGAs) provide a variety of memory blocks with various sizes and widths. FPGAs provide a fixed number of each type of memory block, so a given user design may be limited either by the amount of memory or logic required. Some FPGAs include the ability to use logic resources either as logic or as small memories (look-up table random access memory or LUT RAM). This provides a more flexible tradeoff, because LUT RAM blocks can be used either as logic or memory, providing the ability to balance usage of the blocks and giving a more efficient implementation.

Similarly, conventional structured cell arrays (also known as structured application-specific integrated circuits or structured ASICs) provide a fixed number of logic and memory blocks for the user design, but do not provide a resource that can be used as both. Structured ASICs generally provide a lower non-recurring cost compared to gate array or standard cell ASICs by providing a logic cell that contains a number of logic components and that can be configured as well as routed using a small number of mask layers, principally metal and vias. It is known from FPGA architecture that providing a multi-function resource that can act as either memory or logic can provide significant area reduction compared to architectures that provide only heterogeneous single-function resources. A CAD flow to support efficient mapping of user designs into a mix of LUT RAM and hard memories has been reported (see Ahmed et al. U.S. Pat. No. 7,493,585), as well as efficient methods for implementing multi-function blocks to support LUT RAM (see Lewis et al. U.S. Pat. No. 7,084,665 and Lewis et al. U.S. Pat. No. 7,391,236). Although a block that can serve two functions may not be as area-efficient at either purpose as a single-purpose block, the ability to implement two different functions leads to improved overall efficiency because of the variation in the number of blocks of each type required by the set of user designs that are implemented. The lower block-level efficiency therefore makes dual-purpose blocks more attractive for smaller memories, while larger memories may still be preferably implemented as hard blocks.

SUMMARY OF THE INVENTION

In accordance with certain possible aspects of the invention, memory circuitry is provided on a structured ASIC by employing the logic cells of the structured ASIC. Each of these logic cells is mask-programmable to provide any of several circuit functions. In order to provide a block of memory, a first plurality of the logic cells is mask-programmed to provide an array of memory cells, a second plurality of the logic cells is mask-programmed to provide row decoders for selectively addressing rows in the array of memory cells, and a third plurality of the logic cells is mask-programmed to provide read data buffers for the array of memory cells. Any desired number of the logic cells in a structured ASIC architecture can be used to provide memory in this way. Any logic cells in the architecture that are not thus used for memory can be used for other purposes (e.g., for logic).

In accordance with other possible aspects of the invention, logic cells on a structured ASIC are used to provide memory cells. For example, each logic cell may include two pass gates and five logic signal buffering elements that can be used as inverters. A memory cell comprises three pass gates selected from the pass gates of two of the logic cells, and five inverters selected from the logic signal buffering elements of those two logic cells. Again, any logic cells in a structured ASIC architecture that are not used for memory cells can be used for other purposes such as logic.

In accordance with further possible aspects of the invention a single structured ASIC logic cell can be used to provide a memory cell. Such a logic cell includes two multiplexers and three other circuit elements, each of which is selected from the group consisting of an inverter and a logical function, and each providing signal buffering.

In accordance with still other possible aspects of the invention, circuitry for timing signals used in controlling writing to memory circuitry includes first and second registers, each of which has a data input terminal, a clock input terminal, a reset input terminal, and an output terminal. A write address signal is applied in true and complement form to the data input terminals of the first and second registers, respectively. A clock signal is applied to the input terminals of the registers. A reset signal is applied to the reset input terminals of the registers. Each register outputs (via its output terminal) a register content signal indicative of the current state of that register. Logic circuitry logically combines the clock signal and the register content signals to produce the reset signal. If desired, logic cells in a structured ASIC architecture can be used to provide all of this write timer circuitry. Any logic cells that are not used in this way can be used for other purposes such as logic.

Further features of the invention, its nature and various advantages, will be more apparent from the accompanying drawings and the following detailed description.

DETAILED DESCRIPTION

Figure 1:
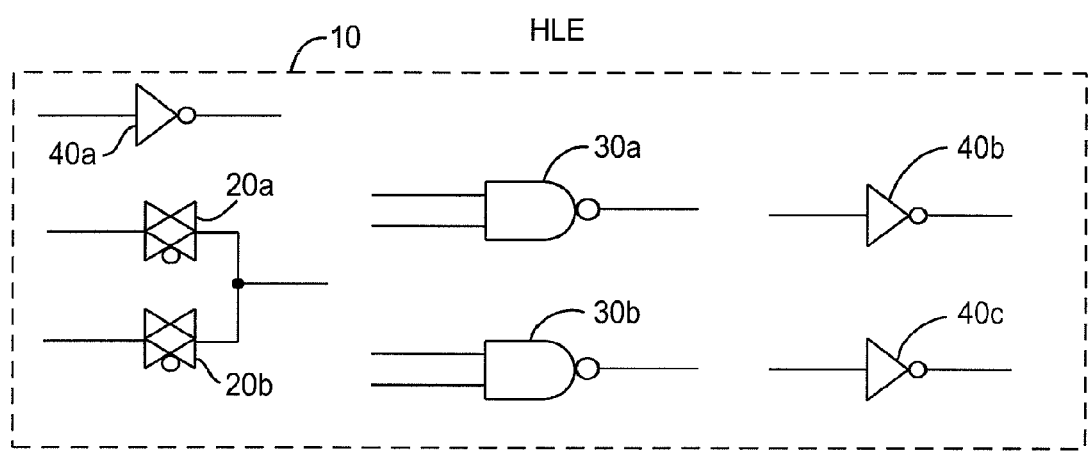
FIG. 1 is a simplified schematic block diagram of components of an illustrative embodiment of a standard structured ASIC logic cell.

Structured cell arrays provide a logic cell that can be programmed using a small number of mask layers to perform a variety of logic functions. The same programming may also be used to provide complex logic functions (e.g., flip flops or complicated logic functions) by coupling together a number of logic cells into a larger unit that is treated as a single complex logic cell. HardCopy II products (commercially available from Altera Corporation of San Jose, Calif.) are an example of this. HardCopy II products employ a simple 18-transistor cell called a hybrid logic element (HLE). Complex logic cells are called composite HLEs (CHLEs). FIG. 1 illustrates the transistor-level components of a HardCopy II HLE 10, but not the mask-programmable connectivity. As shown in FIG. 1, HLE 10 includes pass-gates 20*a* and 20*b*, NAND gates 30*a* and 30*b*, and inverters 40*a*, 40*b*, and 40*c*. The HardCopy II CAD flow maps a user's design into a netlist of CHLEs, using a predefined library of CHLEs. Each CHLE includes a relative placement of HLEs and configuration that couples the elements to implement some function such as a complex logic gate or flip flop. Other logic cell structures can be provided by various structured arrays.

Further customization of the logic fabric to implement a user's circuit is provided by possibly different mask layers that implement routing.

Given this fabric, one possible approach to implementing soft memories is to define a macro that implements one or more of the hard memories. For example, the Stratix II FPGA (also commercially available from Altera Corporation) contains a number of M512 memories that each contain 576 bits of RAM. It is possible to define a macro that implements some of the modes of the M512 (widths, depths, and numbers of ports), and for the software flow to perform mapping into the FPGA memories and output a netlist for the structured cell array that contains instances of the M512 macro to be implemented in HLEs.

A disadvantage of the single macro for an M512 is that any user design needs to construct a fixed size RAM regardless of the actual usage of the memory. Therefore, what is desired is structures that can use the logic fabric provided in a structured cell array to implement variable size "soft" memories, and a CAD flow to support this. Further, due to the primary use of the logic fabric for logic implementation, the freedom to design each transistor individually and use arbitrary circuits and layouts such as sense amplifiers with matched transistors is not readily possible. A second aspect of the invention is that methods to implement soft memories should be robust and focus on simple structures that avoid detailed design considerations that must be evaluated for efficient memories.

Figure 2:
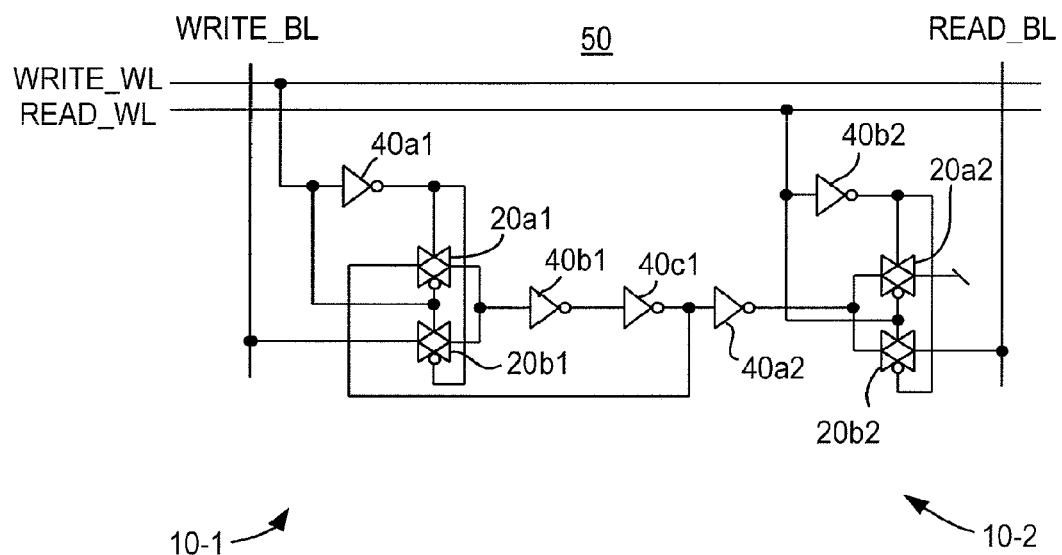
FIG. 2 is a simplified schematic block diagram of an illustrative embodiment of components from structured ASIC logic cells of the type shown in FIG. 1 interconnected to provide a memory cell in accordance with the invention.

Conventional memories use a six-transistor (6 T) cell to minimize area, but require careful design of the memory control circuits and sense amplifiers to operate reliably. LUT RAM opportunistically uses the more robust circuits provided by the LUT. For structured ASICs, it is desirable to use the existing logic cell to implement a memory. An example configuration that uses two HLEs 10 to provide a single-bit memory 50 with one read port and one write port is shown in FIG. 2. (In FIG. 2 the final digit of each reference symbol indicates whether the component is in HLE 1 or HLE 2 (although the allocation of component usage between the two HLEs can be different from that just indicated, if desired.) The HLEs are configured to construct a full static latch (closed loop series connection of inverters 40*b*1 and 40*c*1 through pass gate 20*b*1) with input multiplexer (pass gates 20*a*1 and 20*b*1) and a buffer (inverter 40*a*2 and pass gate 20*a*2) to drive the read bit line. The buffer makes it impossible to upset the RAM cell no matter what state or drive strength is present on the read bit line. A full CMOS pass gate is used to ensure a rail to rail swing and avoid need for precharge. Thus the read path is purely combinational and robust against any activity on the data lines. The read path reverses the conventional usage of the multiplexer, and uses one of the nominal inputs of a multiplexer as the output of the memory cell, and similarly drives the RAM cell onto the nominal output of the multiplexer in order to reduce the loading on the read bit line and eliminate wasted power due to unnecessary activity inside the memory cell. Similarly, the write path uses full CMOS muxes to ensure a robust write.

Figure 8:
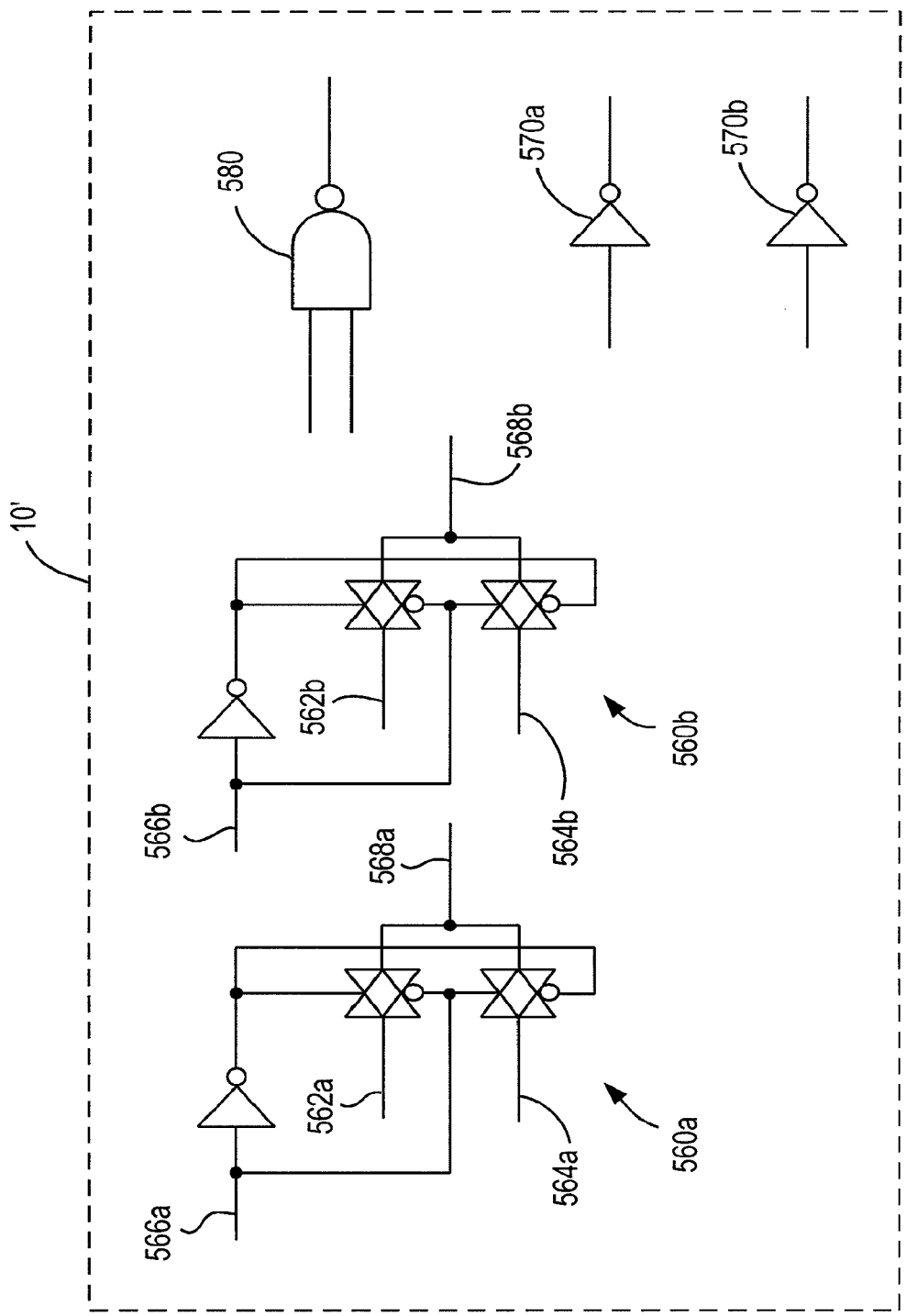
FIG. 8 is a simplified schematic block diagram of components of another illustrative embodiment of a structured ASIC logic cell in accordance with the invention.

An alternative embodiment of an HLE 10' is shown in FIG. 8. A single HLE 10' is mask-programmable to provide one RAM cell. HLE 10' includes first and second multiplexers 560*a* and 560*b*, first and second inverters 570*a* and 570*b*, and two-input NAND gate 580. Each of multiplexers 560 has two selectable inputs 562 and 564, and a selection control input 566 for controlling which of the selectable inputs is connected to an output 568 of the multiplexer. NAND gate 580 can be operated as a third inverter (e.g., by mask-programmably connecting one of its inputs to a source of fixed logic 1). It will be appreciated that any circuit element that provides logic signal buffering, including both inverters and logic gates, can be used to provide a buffering function that is required in the core of the memory cell and the read line driver. These will be referred to simply as "inverters," because current technology will provide logical inversion as well as the signal buffering aspect. Thus other HLEs containing various numbers of inverters and logic gates can be used in a similar manner.

From the foregoing description of HLE 10' it will be seen how the components of one such HLE can be mask-programmably mapped to what is shown in FIG. 2 (i.e., one RAM cell 50). The first multiplexer 560*a* can provide what is provided by elements 20*a*1, 20*b*1, and 40*a*1 in FIG. 2. Two of elements 570*a/b* and 580 (functioning as a third inverter) can provide what is provided by elements 40*b* and 40*c*1 in FIG. 2. The third of elements 570*a/b* and 580 can provide what is provided by element 40*a*2 in FIG. 2. And second multiplexer 560*b* can provide what is provided by elements 20*a*2, 20*b*2, and 40*b*2 in FIG. 2. All of the other connections and conductor elements shown in FIG. 2 can be mask-programmably provided so that the elements of HLE 10' function as a RAM cell exactly as described earlier with reference to FIG. 2.

Figure 3:
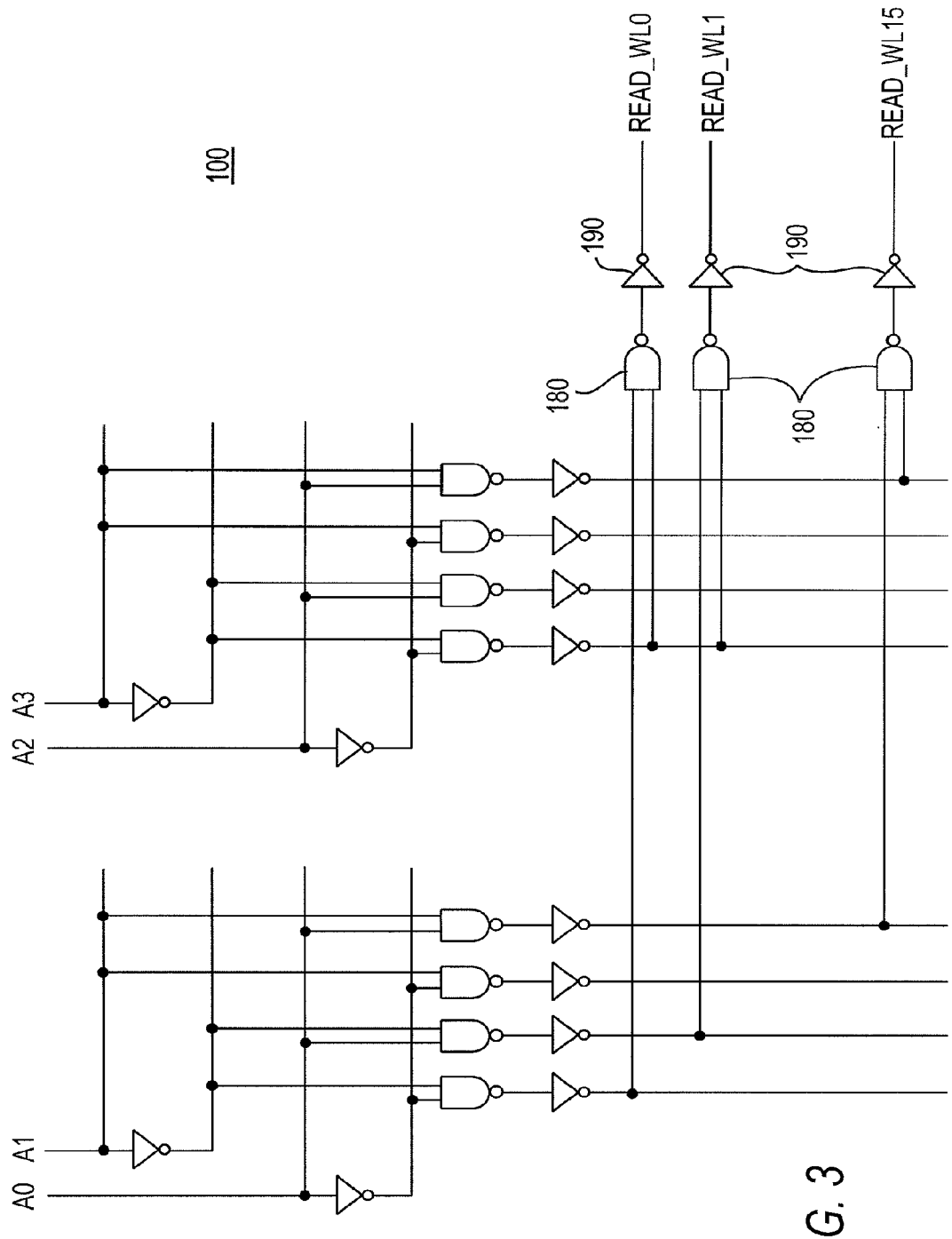
FIG. 3 is a simplified schematic block diagram of an illustrative embodiment of memory address decoder circuitry that can be implemented in accordance with the invention.

Returning to FIG. 2, although the read path is combinational and robust due to the buffered bit line driver, the write path needs detailed consideration of the timing to ensure that it is robust. FIG. 3 shows a conventional address decoder 100 comprising two two-to-four decoders and AND gates for the word lines. Registers (not shown) would be provided for synchronous operation. Other write timer circuitry and/or additional clocks that are not shown may be helpful to ensure that the write pulse is sufficiently wide and that the timing constraints of address and data are obeyed.

Figure 4:
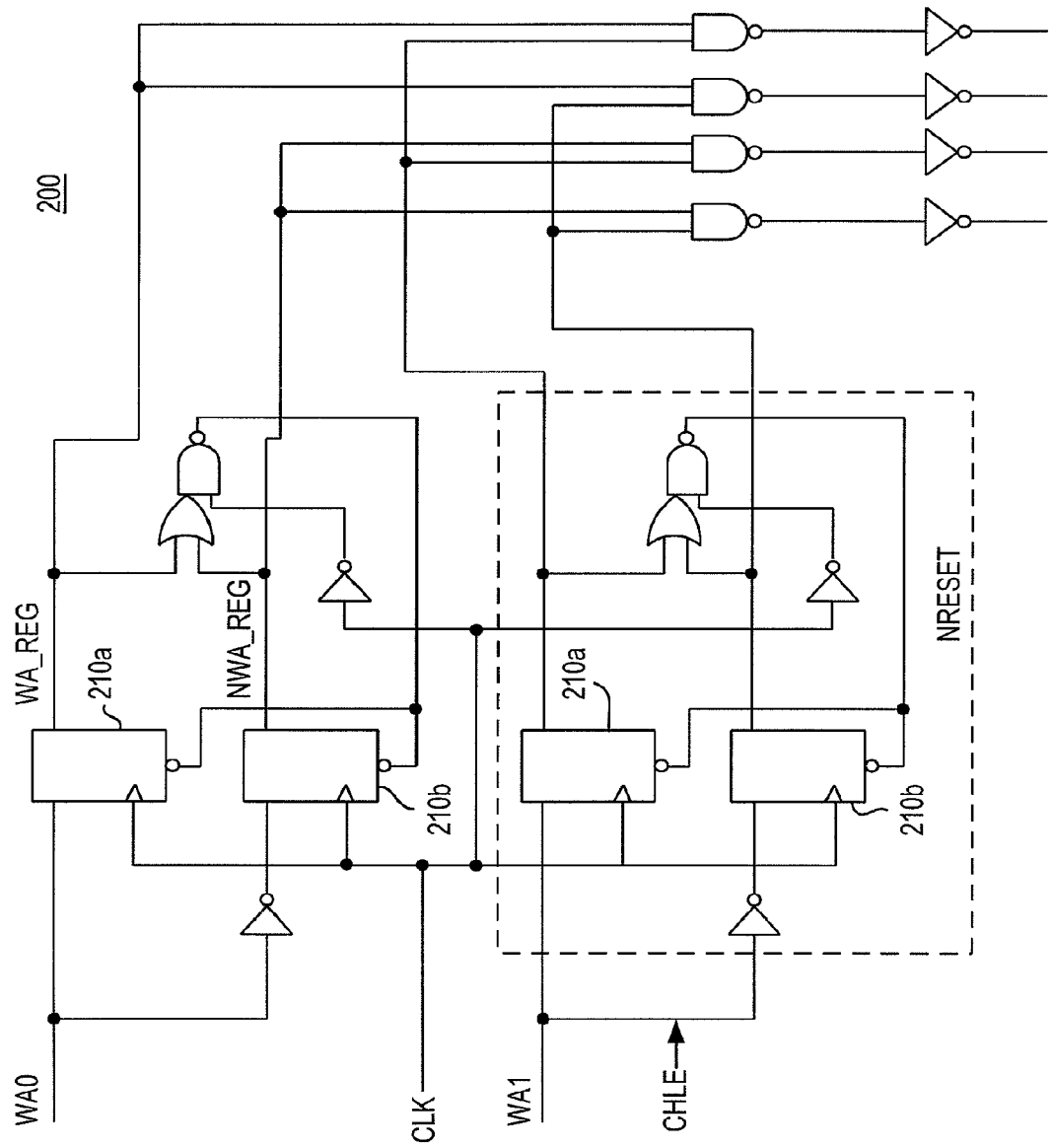
FIG. 4 is a simplified schematic block diagram of an illustrative embodiment of memory write address signal processing circuitry in accordance with the invention.
Figure 5:
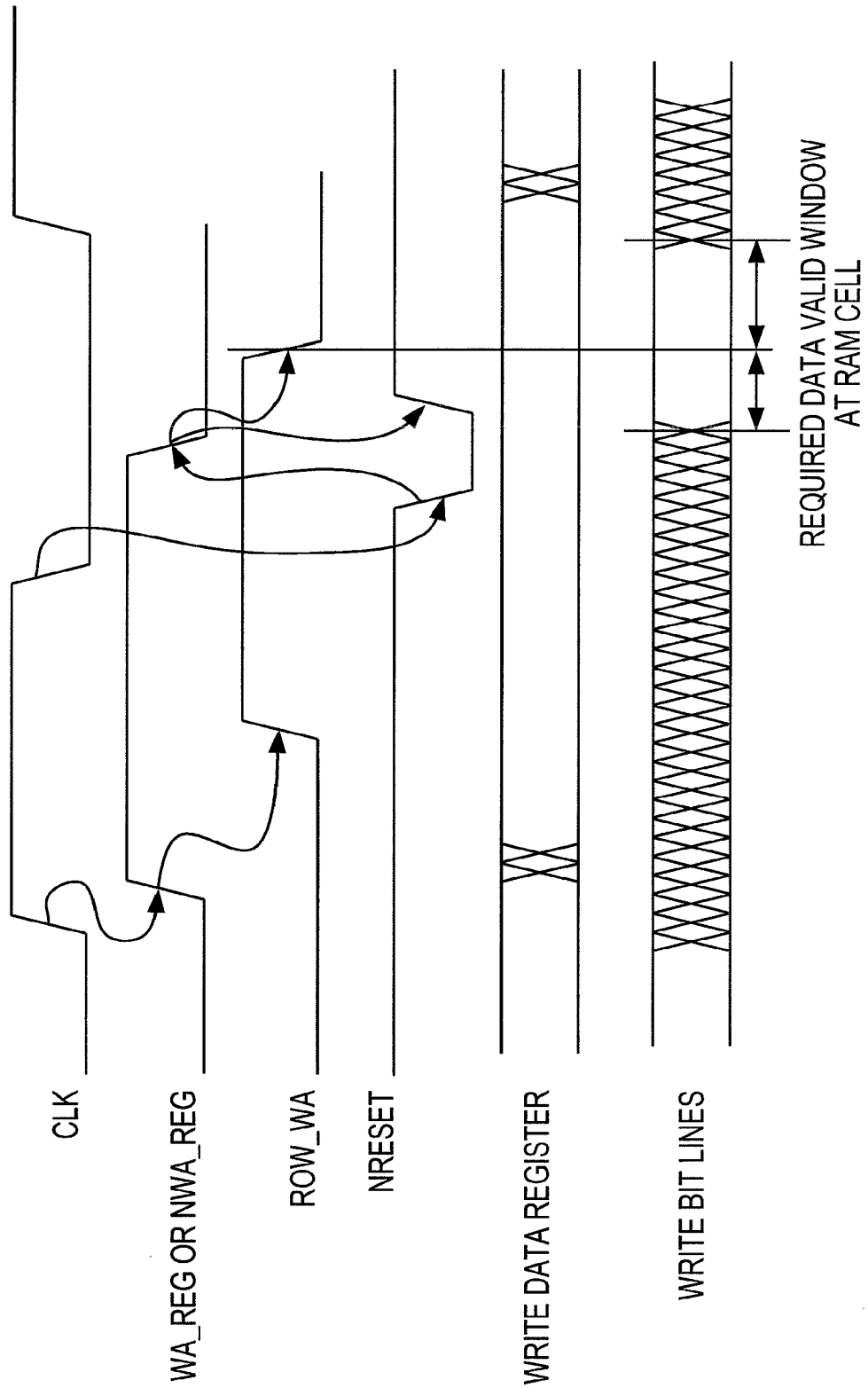
FIG. 5 is a set of simplified waveforms for several illustrative signals in circuitry of the type shown in FIG. 4 under certain operating conditions of that circuitry.

The dual-rail write address register and predecoder 200 shown in FIG. 4 ensures that write timing is robust with a minimum of constraints or detailed circuit analyses of the design. (See also the associated timing diagrams in FIG. 5.)

The dual-rail write register comprises two FFs 210*a* and 210*b* per address bit that respectively store the address bit and its complement. Both registers 210 are reset before the clock edge arrival, and a clock on the write address register causes one of the FFs to assert. This propagates through the predecoder and eventually to the write word line decoder, causing one write word line to assert. When the clock falls, the OAI (OR-AND-Invert) gate generates a reset signal that resets both address registers 210, thereby guaranteeing that they are both 0 at the start of the next clock edge. As a result of this, the write word line negates during the low phase of the clock cycle. This leads to relatively mild timing constraints on the write data line. Because the cell 50 (FIG. 2) is a full D latch, the write data bit line needs to meet a setup and hold time constraint with respect to the falling edge of the write word line. Because the write word line will fall in the negative clock phase, there is at least a half clock cycle for the data to propagate into the write data lines, and a hold time requirement exists with respect to the falling edge of the clock. This combination of timing constraints ensures that the write will succeed up to some frequency, without the need to match any delays in the memory.

Figure 6:
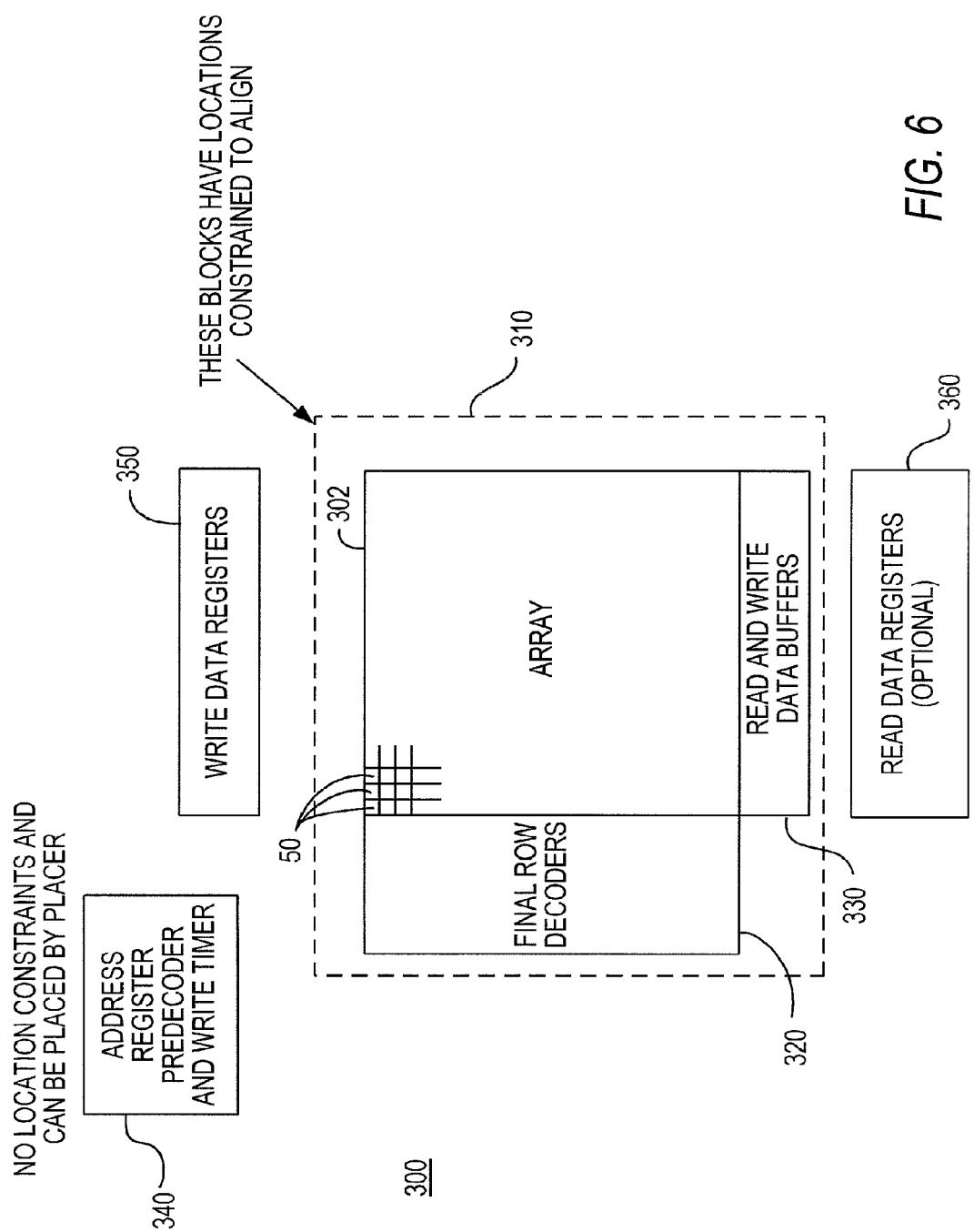
FIG. 6 is a simplified block diagram of an illustrative embodiment of how memory circuitry may be placed on a structured ASIC in accordance with the invention.

FIG. 6 shows an overview of a memory 300 constructed from these cells 50 and associated logic. The memory comprises a core 310 including the cells 50, the final stage of the address decoder 320 (corresponding to elements 180/190 in FIG. 3, and read buffer circuitry 330. These components may be constrained in relative placement to ensure that cells 50 are butted together to minimize wiring requirements and ensure predictable timing. The remainder of the logic, comprising read address registers, write address registers, predecoder and timer (all collectively component 340), write data registers 350, and optional read data registers 360 may be constructed from CHLEs. These blocks (340, 350, and 360) do not need to be location-constrained, so the placer algorithm may take advantage of this placement freedom to maximize performance. As a result, elements like 340, 350, and/or 360 may be separated from core 310 by other logic cells 10/10' that are being used for other purposes.

Timing analysis in CAD flows for modern devices may not support tri-state cells, which would be required to model the timing properties of the RAM at a bit cell level granularity. It is therefore also advantageous to treat a column of the memory core as a single block for timing purposes. When considered as a single logical block, a column of cells 50 and the associated read buffer can be considered to be purely combinational with a defined delay from each of the read row lines to the data output. Each RAM core is constructed from one or more column slices, and the set of available slices may include a moderate number of predefined and characterized CHLEs; for example, a 4, 8, 16, 32, or 64 deep column slice.

Figure 7:
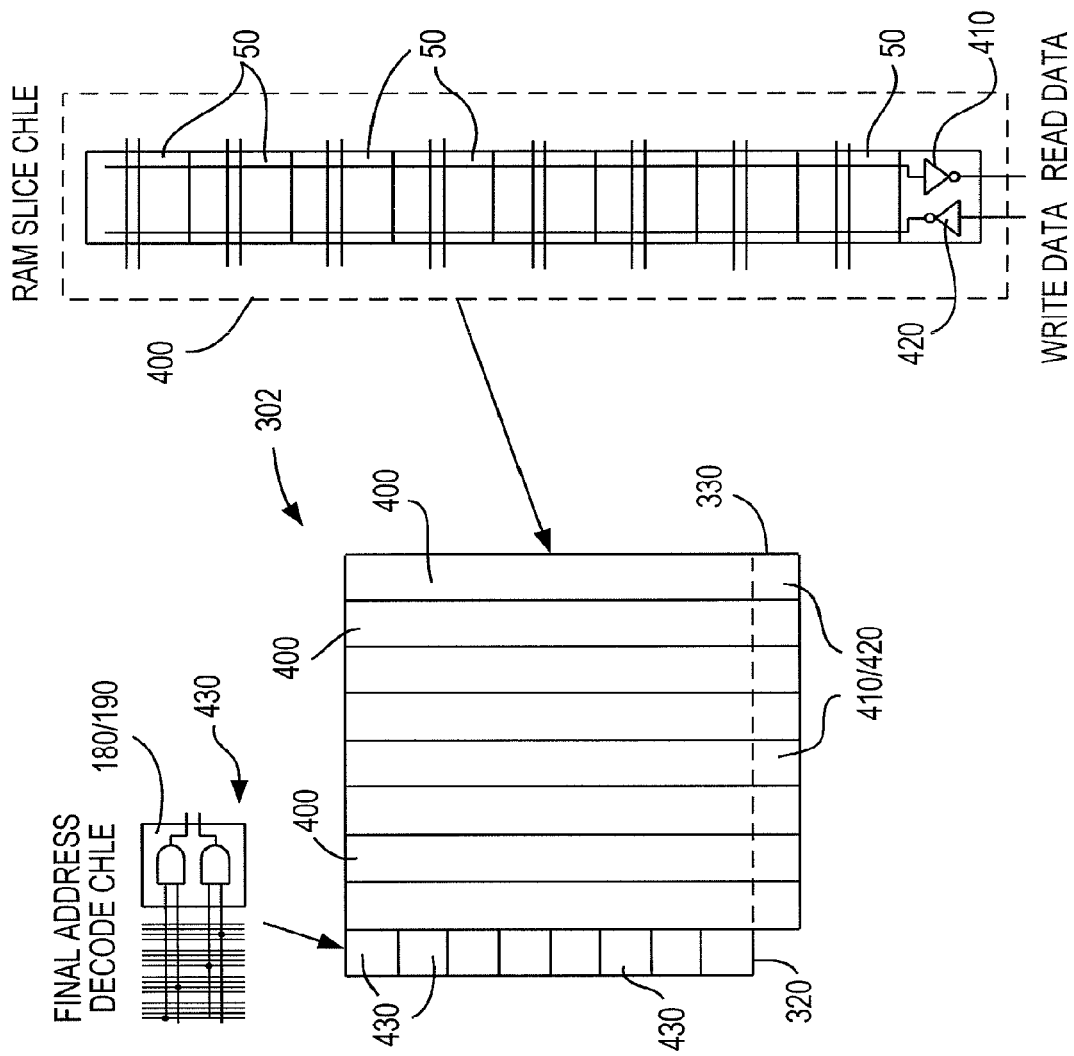
FIG. 7 is a simplified block diagram of an illustrative embodiment of a memory macro and an assembly of such memory macros in accordance with the invention.

FIG. 7 illustrates a typical column slice 400 that would include the RAM cells 50, a read buffer 410, and a write buffer 420 to ensure electrical integrity. The read access delay of a RAM constructed from slices 400 may be easily determined using standard timing analysis that models the capacitance of the word lines and its delay effect on the word line driver, as well as the delay of each slice. The read delay of the slice 400 from word line to data out is approximately constant for a given slice depth. More accurate modeling would include the effect of the rise time of the word line, in turn determined by the number of slices loading the driver. Similar properties apply to the write timing, which has setup/hold time requirements of the data with respect to the word lines. Thus accurate modeling of the RAM core 302 delay can be performed using conventional gate level timing models that include RC loading effects and rise/fall time effects on delay. The CHLEs 430 for the final stage address decoder are also illustrated.

Slices may also be defined with a range of widths, and RAM cores 310 may be constructed from a limited number of predefined widths to simplify timing characterization and analysis. For example, one might define slices with a fixed width of 4, and depths of 4, 8, 16, 32, and 64, and constrain the width of a constructed RAM to be a power of 2 and no greater than 32 in order to have a limited number of RAM core sizes, allowing all unique core sizes to be characterized with moderate effort. One can also form similar constraints on width even if the slice width is not the same as the set of implemented RAM sizes. For example, using the one-bit wide RAM slice, it is possible to enforce constraints that RAM cores of widths 1, 2, 4, 8, 9, 16, 18, 32, or 36 are supported, again to be able to accurately characterize the timing of all RAM cores. However, it is an advantage of the invention that it is possible for conventional timing analysis to accurately model the delays of the soft memory using only a small set of slices of a single width, reducing the need to characterize a set of different depths and widths.

Additionally, as in LUT RAM, soft logic may be synthesized to stitch multiple RAMs in width or depth, using a library or parameterized logic generators. This would include generating output multiplexers for read data, and address decoders for write enables.

Figure 9:
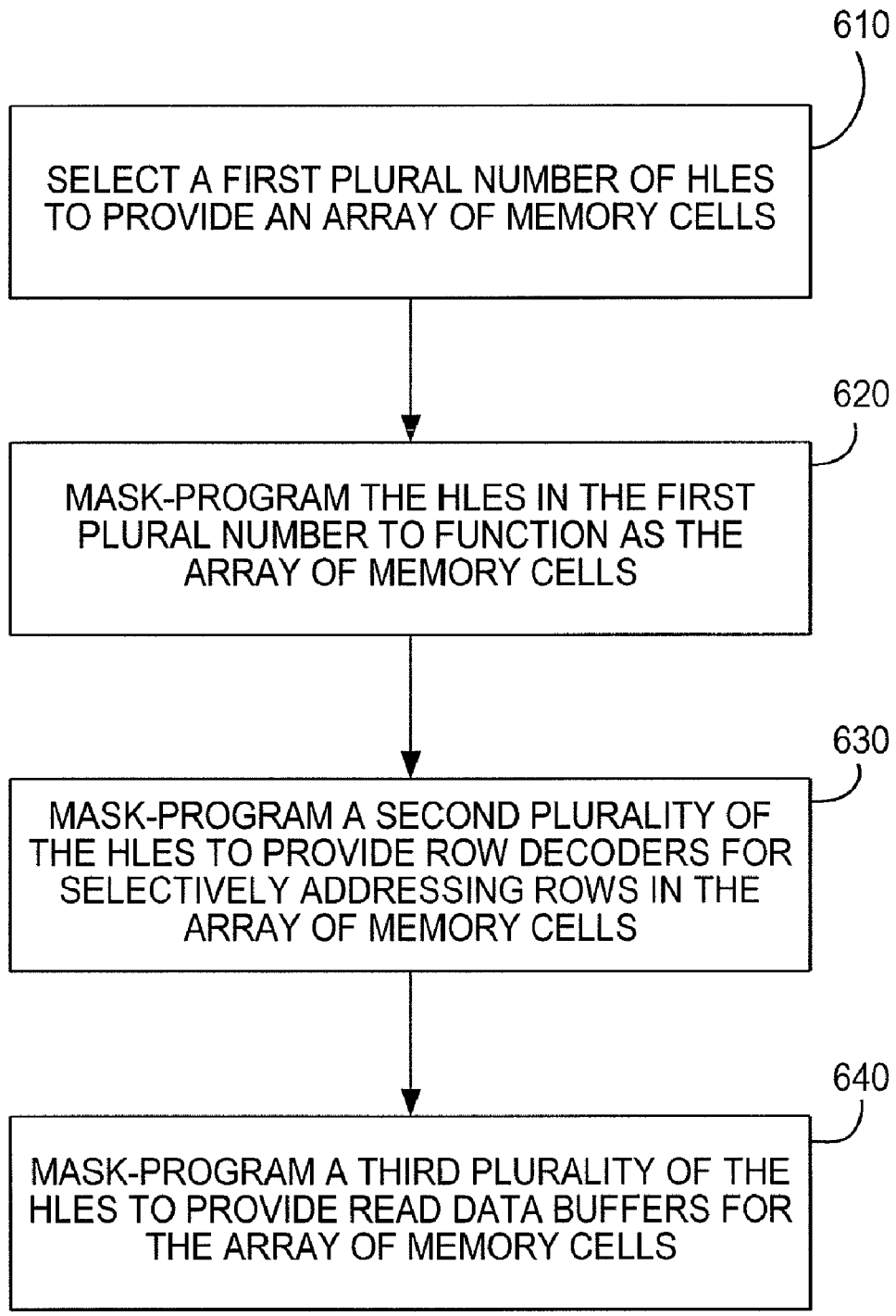
FIG. 9 is a simplified flow chart of an illustrative embodiment of certain method aspects of the invention.

An illustrative method aspect of the invention (related to what is illustrated by FIG. 6) is shown in FIG. 9. This relates to using HLEs like 10 or 10' to provide memory arrays like 310 in FIG. 6 having any of a number of different sizes. In step 610 a first plural number of HLEs is selected to provide an array of memory cells. The size of the first plural number is selectable, whereby the array of memory cells can have any one of a plurality of different memory array sizes.

In step 620 the HLEs in the first plural number are mask-programmed to function as the array of memory cells.

In step 630 a second plurality of the HLEs are mask-programmed to provide row decoders (e.g., like 320 in FIG. 6) for selectively addressing rows in the array of memory cells.

In step 640 a third plurality of the HLEs are mask-programmed to provide read data buffers (e.g., like 330 in FIG. 6) for the array of memory cells.

Figure 10:
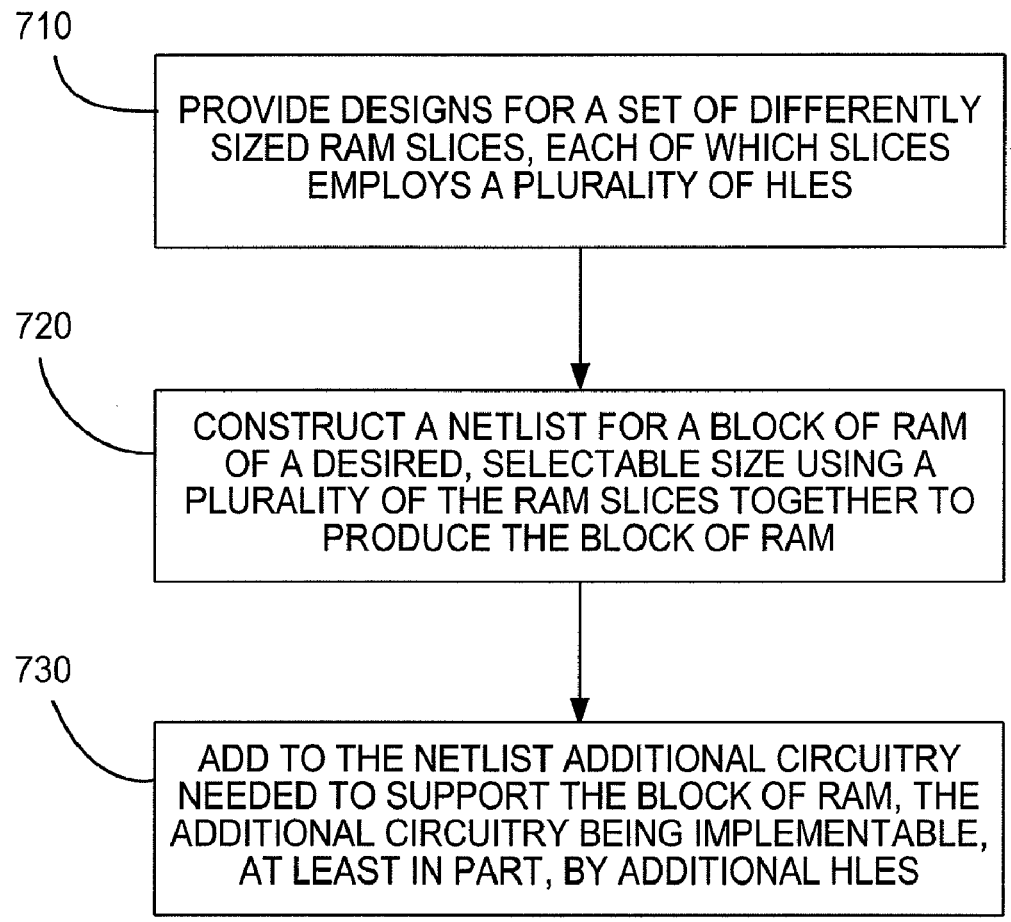
FIG. 10 is a simplified flow chart of an illustrative embodiment of certain other method aspects of the invention.

Another illustrative method aspect of the invention (related to what is illustrated by FIG. 7) is shown in FIG. 10. This relates to configuring differently sized memory arrays (like 302 in FIG. 7) from differently sized RAM slices (like 400 in FIG. 7). In step 710 designs for a set of differently sized RAM slices are provided. Each of these RAM slices employs a plurality of HLEs like 10 or 10'.

In step 720 a netlist for a block of RAM is constructed. The block of RAM is of a desired, selectable size. The netlist is constructed using a plurality of the RAM slices together to produce the block of RAM.

In step 730 additional circuitry is added to the netlist. The additional circuitry is circuitry that is needed to support the block of RAM. The additional circuitry is implementable, at least in part, by additional HLEs. Examples of such additional circuitry that may be added in step 730 include address registers, row decoders, write data registers, and/or read data registers.

As used herein and in the appended claims the term "hybrid logic element" or "HLE" means a relatively small block of circuitry including a set of predefined transistors and metallization such that some (but not all) of the connections between the transistors are fixed and define specific logic functions, many identical instances of such HLE structure being provided on an integrated circuit, and each HLE instance being mask-customizable or mask-programmable (e.g., with additional metallization) whereby each HLE can implement at least one predefined two-input logic function.

In some embodiments of the invention the maximum logic capability of each HLE is relatively small as compared, for example, to the maximum logic capability of a typical FPGA logic module (LM). Such an FPGA LM may include a four-input look-up table (4-LUT), and may therefore be capable of providing an output signal that can be any logical combination of the four inputs to the 4-LUT. In the embodiments of this invention that are being specifically described in this paragraph the maximum logic capability of an HLE is less than the maximum logic capability of such a 4-LUT. The term "under-four-HLE" is used herein for HLEs in these embodiments. An under-four-HLE may be able to implement any of several two-input logic functions (possibly even any two-input logic function). But it does not have enough logic capability to implement any four-input logic function (like an FPGA 4-LUT can). In other respects, an under-four-HLE is like an HLE as defined elsewhere in this specification.

It will be understood that the foregoing is only illustrative of the principles of the invention, and that various modifications can be made by those skilled in the art without departing from the scope and spirit of the invention. For example, the number of cells 50 in a memory slice 400 of the type shown in FIG. 7 can be more or less than the illustrative number (eight) shown in FIG. 7. Similarly, the number of slices 400 in a memory array 302 can be different from the illustrative number (eight) shown in FIG. 7. Terms like row and column are used herein only as relative terms, and not with the intention of limiting the disclosure or claims to circuitry having any particular fixed rotational orientation relative to an observer. Thus, what is referred to as a row in the illustrative embodiments shown and described herein can be oriented horizontally, vertically, or at any other angle with respect to an observer. The same is true for what is referred to as a column herein. Rows and columns are, however, generally substantially perpendicular to one another. Also, in the appended claims, terms like first, second, third, fourth, etc., are used as arbitrary reference terms, and not with any particular numerical order in mind. A claim may refer, for example, to a fifth element with no implication that the claim also requires first through fourth elements (unless those other elements are expressly required by other wording or expressly stated dependency of the claim).

The invention claimed is:

1. Hybrid logic element circuitry comprising:
   first and second multiplexers, each of which has first and second selectable inputs and a selection control input for controlling which of the selectable inputs is connected to an output of the multiplexer;
   first and second inverters; and
   a two-input NAND gate;
   the hybrid logic element circuitry being mask-programmable to provide a memory cell by mask-programming the NAND gate to operate as a third inverter, by mask-programmably connecting two of the first through third inverters in a closed loop series that includes the first selectable input and the output of the first multiplexer, and by mask-programmably connecting a point in the closed loop series to the second multiplexer via a third of the first through third inverters.

2. The circuitry defined in claim 1 further comprising:
   a mask-programmable connection from a write word line conductor to the selection control input of the first multiplexer.

3. The circuitry defined in claim 2 further comprising:
   a mask-programmable connection from a write bit line conductor to the second selectable input of the first multiplexer.

4. The circuitry defined in claim 3 further comprising:
   a mask-programmable connection from the second multiplexer to a read bit line conductor.

5. The circuitry defined in claim 4 further comprising:
   a mask-programmable connection from a read word line conductor to the selection control input of the second multiplexer.

6. Hybrid logic element circuitry comprising:
   first and second multiplexers, each of which has first and second selectable inputs and a selection control input for controlling which of the selectable inputs is connected to an output of the multiplexer; and
   first, second, and third circuit elements, each of which is selected from the group consisting of an inverter and a logical function, and each providing signal buffering;
   the hybrid logic element circuitry being mask-programmable to provide a memory cell by mask-programmably connecting two of the first through third circuit elements in a closed loop series that includes the first selectable input and the output of the first multiplexer, and by mask-programmably connecting a point in the closed loop series to the second multiplexer via a third of the first through third circuit elements.

7. The circuitry defined in claim 6 further comprising:
   a mask-programmable connection from a write word line conductor to the selection control input of the first multiplexer.

8. The circuitry defined in claim 7 further comprising:
   a mask-programmable connection from a write bit line conductor to the second selectable input of the first multiplexer.

9. The circuitry defined in claim 8 further comprising:
   a mask-programmable connection from the second multiplexer to a read bit line conductor.

10. The circuitry defined in claim 9 further comprising:
    a mask-programmable connection from a read word line conductor to the selection control input of the second multiplexer.

11. The circuitry defined in claim 6 wherein one of the first through third circuit elements is a NAND gate.

12. The circuitry defined in claim 6 wherein one of the first through third circuit elements is a NOR gate.

* * * * *